US008916797B2

(12) United States Patent
Park

(10) Patent No.: US 8,916,797 B2
(45) Date of Patent: Dec. 23, 2014

(54) CRYSTALLIZATION APPARATUS USING SEQUENTIAL LATERAL SOLIDIFICATION

(75) Inventor: Cheol-Ho Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 507 days.

(21) Appl. No.: 13/317,694

(22) Filed: Oct. 26, 2011

(65) Prior Publication Data

US 2012/0111267 A1    May 10, 2012

(30) Foreign Application Priority Data

Nov. 5, 2010   (KR) .................... 10-2010-0109776

(51) Int. Cl.
*B23K 26/02* (2014.01)
*H01L 21/67* (2006.01)
*B23K 26/06* (2014.01)
*H01L 27/12* (2006.01)

(52) U.S. Cl.
CPC ....... *B23K 26/0639* (2013.01); *H01L 21/67115* (2013.01); *H01L 27/1285* (2013.01)
USPC ................. 219/121.61; 219/121.73

(58) Field of Classification Search
CPC ........ B23K 26/00; B23K 26/06; B23K 26/08; B23K 26/0639; H01S 3/00; H01L 21/00; H01L 27/1285; H01L 21/324; H01L 21/67115; H01L 31/18; H01L 31/186; H01L 31/1864; H01L 31/1868; H01L 31/1872
USPC ............ 219/121.65, 121.66, 121.73–121.75, 219/121.61; 118/620, 641; 438/795
See application file for complete search history.

(56) References Cited

U.S. PATENT DOCUMENTS

| | | | | |
|---|---|---|---|---|
| 7,009,140 | B2 * | 3/2006 | Partio et al. ............. | 219/121.65 |
| 7,112,517 | B2 * | 9/2006 | Tanaka et al. ................ | 438/487 |
| 7,193,693 | B2 * | 3/2007 | Yazaki et al. .................. | 356/30 |
| 2005/0170572 | A1 | 8/2005 | Hongo et al. | |

FOREIGN PATENT DOCUMENTS

| | | |
|---|---|---|
| JP | 2000-252228 | 9/2000 |
| JP | 2003-158086 | 5/2003 |
| JP | 2005-032847 | 2/2005 |
| KR | 10-2009-0031878 A | 3/2009 |

* cited by examiner

*Primary Examiner* — Samuel M Heinrich
(74) *Attorney, Agent, or Firm* — Lee & Morse, P.C.

(57) ABSTRACT

A crystallization apparatus that performs crystallization on a substrate using sequential lateral solidification (SLS) includes a laser generating device for emitting a laser beam, a first telescope lens module and a second telescope lens module at one side of the laser generating device for minimizing a divergent angle of a laser beam emitted by the laser generating device; and a main optical system at one side of the second telescope lens module for uniformizing and amplifying a laser beam transmitted through the second telescope lens module. The main optical system is rotatably formed with respect to the laser generating device.

14 Claims, 5 Drawing Sheets

CRYSTALLIZATION APPARATUS USING SEQUENTIAL LATERAL SOLIDIFICATION

CROSS REFERENCE TO RELATED PATENT APPLICATION

This application claims the benefit of Korean Patent Application No. 10-2010-0109776, filed on Nov. 5, 2010, in the Korean Intellectual Property Office, the disclosure of which is incorporated herein in its entirety by reference.

BACKGROUND

1. Field

One or more aspects relate to crystallization apparatuses, and more particularly, to crystallization apparatuses using sequential lateral solidification (SLS), in which a main optical system is formed so as to be capable of tilting at a predetermined angle with respect to a laser generating device, thereby simultaneously preventing formation of a strain during crystallization or formation of a non-crystallization area.

2. Description of the Related Art

Active matrix (AM) type organic light emitting display apparatuses include a pixel driving circuit in respective pixels. The pixel driving circuit includes a thin film transistor (TFT) formed of silicon. Amorphous silicon or polycrystalline silicon may be used as the silicon constituting the TFT.

In regard to an amorphous silicon TFT (a-Si TFT) used in the pixel driving circuit, since a semiconductor active layer constituting a source, a drain, and a channel is formed of amorphous silicon, the amorphous silicon TFT has low electron mobility. Thus, a polycrystalline silicon TFT instead of the amorphous silicon TFT is now being used. The polycrystalline silicon TFT has high electron mobility and superior light irradiation stability compared to the amorphous silicon TFT. Thus, the polycrystalline silicon TFT is very suitable for use as an active layer of a driving and/or switching TFT of an active matrix organic light emitting display apparatus.

The polycrystalline silicon TFT may be manufactured using various methods. The various methods may be largely classified into a method in which polycrystalline silicon is directly deposited and a method in which amorphous silicon is deposited and crystallizing the deposited amorphous silicon. The method for depositing the polycrystalline silicon may include a chemical vapor deposition (CVD) method, a photo CVD method, a hydrogen radical (HR) CVD method, an electron cyclotron resonance (ECR) CVD method, a plasma enhanced (PE) CVD method, or a low pressure (LP) CVD method.

The method in which the amorphous silicon is deposited and the deposited amorphous silicon is crystallized may include a solid phase crystallization (SPC) method, an excimer laser crystallization (ELC) method, a metal induced crystallization (MIC) method, a metal induced lateral crystallization (MILC) method, or a sequential lateral solidification (SLS) method.

The SPC method is not very practical since it needs to be performed at a temperature greater than about 600° C. for a long period of time. The ELC method may realize low-temperature crystallization. However, since a laser beam is expanded using an optical unit, uniformity may be deteriorated. Meanwhile, the MIC method has a low crystallization temperature since a metal thin film is deposited on a surface of amorphous silicon and a silicon layer is crystallized by using the metal thin film as a crystallization catalyst. However, since polycrystalline silicon is contaminated by the metal, characteristics of a TFT device including a silicon layer may be deteriorated. Also, formed crystals may have a small size and the crystals may be distributed in a disorderly manner.

The SLS method uses the fact that grains of silicon grow in a direction perpendicular to a border surface between liquid-state silicon and solid-state silicon, where a-Si is crystallized by partially melting a-Si by irradiating a laser beam through a particular portion of the a-Si by using a mask and growing crystals from the border between the melted portion and an un-melted portion, in a direction toward the melted portion. The SLS is receiving attention as a method of fabricating low temperature poly-Si.

SUMMARY

According to an embodiment, there is provided a crystallization apparatus that performs crystallization on a substrate using a sequential lateral solidification (SLS) method, the crystallization apparatus including a laser generating device for emitting a laser beam, a first telescope lens module and a second telescope lens module at one side of the laser generating device for minimizing a divergent angle of a laser beam emitted by the laser generating device, and a main optical system formed at one side of the second telescope lens module for uniformizing and amplifying a laser beam transmitted through the second telescope lens module, wherein the main optical system is rotatable with respect to the laser generating device.

The second telescope lens module and the main optical system may be integrally rotatable with respect to the laser generating device.

When the main optical system is rotatable at a predetermined angle, an entire portion of a crystallization region of the substrate where crystallization is to be performed may be contained in a laser irradiation region.

The main optical system may include a beam uniformizer for ensuring that a profile of a laser beam transmitted through the second telescope lens module with predetermined power is uniform and a beam width controller for controlling a beam width of a laser beam transmitted through the beam uniformizer to be maintained within a predetermined range.

The crystallization apparatus may further include an extension optical system interposed between the laser generating device and the first telescope lens module, the extension optical system extending a sustain period per pulse of a laser beam emitted from the laser generating device.

A laser beam transmitted through the main optical system and irradiated onto the substrate may be a linear laser beam.

The laser beam generated by the laser generator may be irradiated onto the substrate while the substrate is relatively movable with respect to the crystallization apparatus.

The laser beam generated by the laser generating device may be a pulse laser beam.

A first laser irradiation region of the substrate onto which the pulse laser beam is irradiated may partially overlap with a second laser irradiation region of the substrate onto which the pulse laser beam is subsequently irradiated.

Amorphous silicon of an overlapped region of the first laser irradiation region and the second irradiation region may be crystallized while being dissolved and solidified two times.

The crystallization apparatus may further include a base plate to which the substrate is fixed, and a rotation member spaced apart from the base plate by a predetermined interval, and rotatably disposed on the base plate. The main optical system may be disposed on the rotation member, and the rotation member may be rotatable with respect to the base plate.

The crystallization apparatus may further include a plurality of columns extending from one surface of the base plate, and a support member on the plurality of columns, wherein the rotation member is on the support member.

The second telescope lens module may be coupled to the main optical system, and may be rotatable together with the main optical system with respect to the base plate.

The rotation member be rotatable on a plate disposed in parallel to a surface of the substrate to which the laser beam is irradiated.

BRIEF DESCRIPTION OF THE DRAWINGS

The above and other features and advantages of the embodiments will become more apparent by describing in detail exemplary embodiments thereof with reference to the attached drawings in which.

DETAILED DESCRIPTION

Embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

Figure 1A:
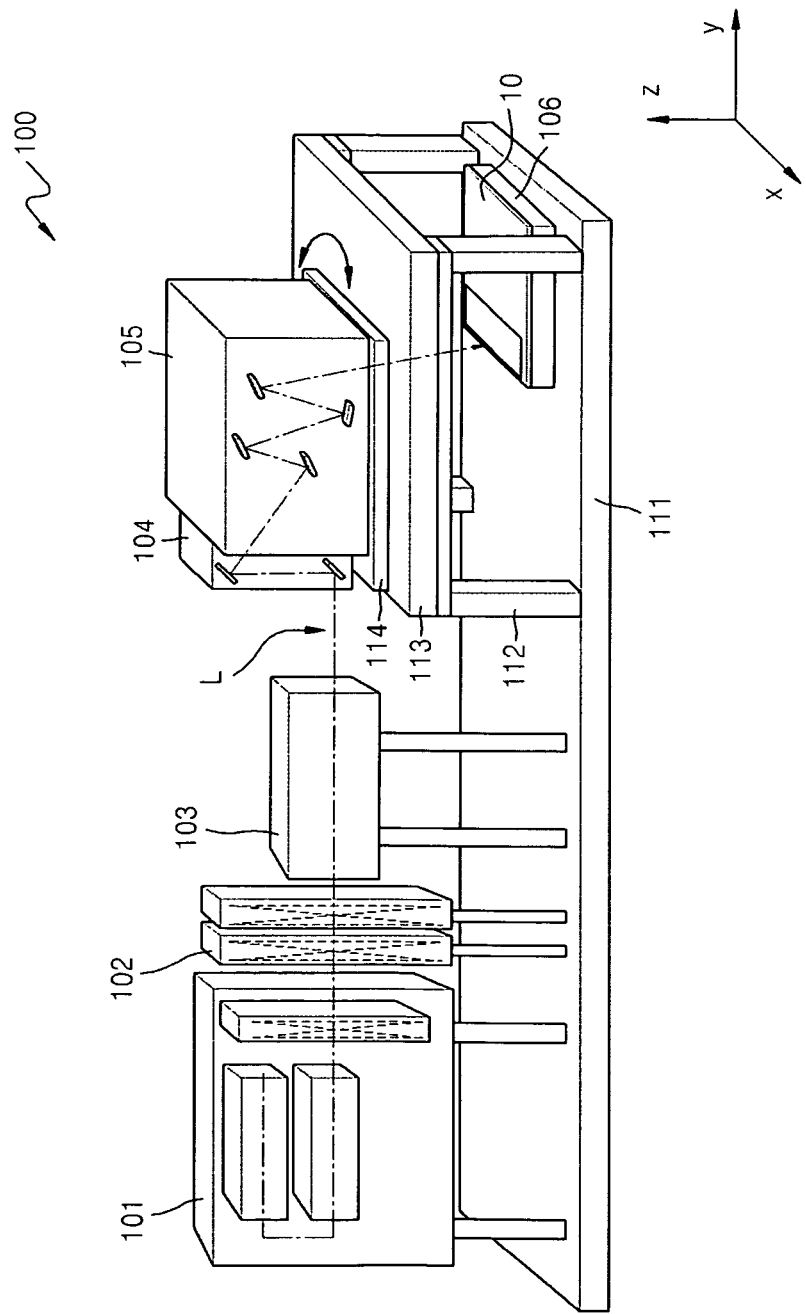
FIG. 1A illustrates a schematic diagram of a crystallization apparatus according to an embodiment.
Figure 1B:
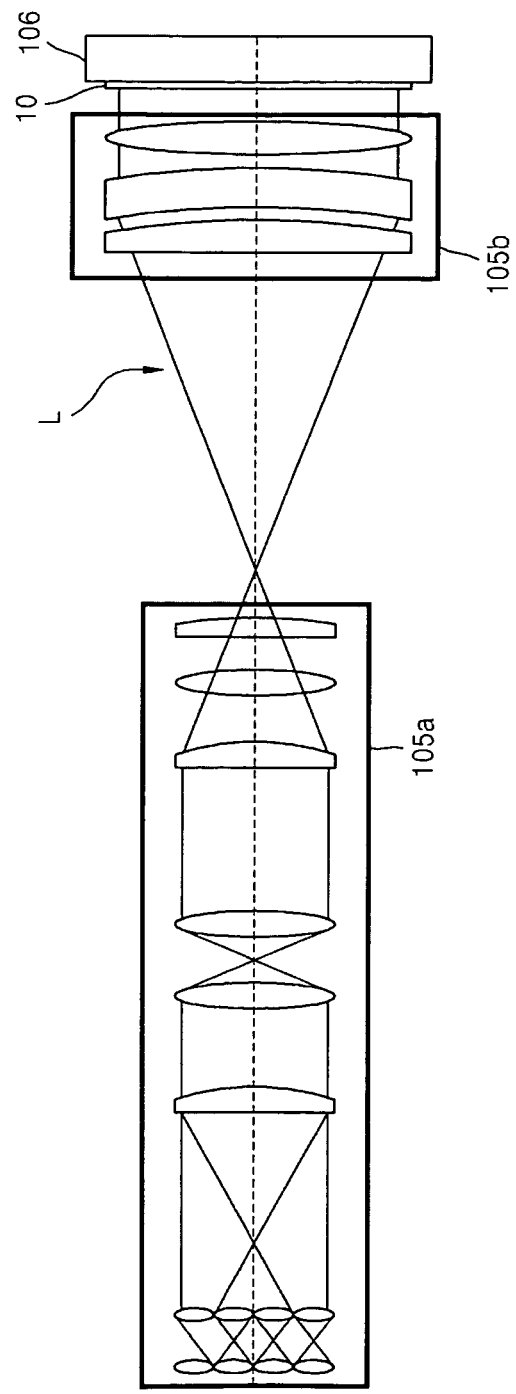
FIG. 1B illustrates a detailed diagram of a main optical system of the crystallization apparatus of FIG. 1A.

FIG. 1A illustrates a schematic diagram of a crystallization apparatus 100 according to an embodiment. FIG. 1B illustrates a detailed diagram of a main optical system of the crystallization apparatus 100 of FIG. 1A.

Referring to FIGS. 1A and 1B, the crystallization apparatus 100 may include a laser generating device 101 for generating a laser beam L, an extension optical system 102 for extending a sustain period per pulse of the laser beam L emitted from the laser generating device 101, a first telescope lens module 103 and a second telescope lens module 104 that minimizes a divergent angle of the laser beam L transmitted through the extension optical system 102, and a main optical system 105 for linearizing the laser beam L transmitted through the first telescope lens module 103 and the second telescope lens module 104 by uniformizing and amplifying the laser beam L.

In detail, the laser generating device 101 generates the laser beam L in order to perform crystallization. In this case, the laser beam L may be a pulse laser beam, which will be described in more detail below.

The extension optical system 102 extends a sustain period per pulse of the laser beam L emitted from the laser generating device 101. Since the laser beam L generated from the laser generating device 101 has a short irradiation time per pulse (e.g., about 10 nanoseconds), such a laser beam L may not be sufficient to perform crystallization. Thus, the extension optical system 102 may increase a duration time per pulse of the laser beam L so as to irradiate the laser beam L onto a substrate 10 for a sufficient period of time to perform crystallization.

The first telescope lens module 103 and the second telescope lens module 104 may be formed at one side of the extension optical system 102, and minimize a divergence angle of the laser beam L transmitted through the extension optical system 102. In addition, the first telescope lens module 103 and the second telescope lens module 104 may include reflective mirrors formed therein, and may divert a path of the laser beam L.

The main optical system 105 may be formed on one surface of the second telescope lens module 104 and may include a beam uniformizer 105a and a beam width controller 105b. The beam uniformizer 105a ensures that a profile of the laser beam L transmitted through the second telescope lens module 104 is uniform so that the laser beam L with predetermined power may be irradiated onto the substrate 10. The beam width controller 105b controls the beam uniformizer 105a so that a width of the laser beam L that has a linear shape as amplified in a lengthwise-axis direction while passing through the beam uniformizer 105a does not extend indefinitely.

An x-y stage 106, to which the substrate 10 including an amorphous silicon layer disposed thereon is fixed, may be positioned at a location corresponding to the main optical system 105. In this case, a crystallization region of the substrate 10 may be enlarged by relatively moving the x-y stage 106 with respect to the main optical system 105 in order to crystallize an entire portion of the substrate 10.

The second telescope lens module 104, the main optical system 105 and the x-y stage 106 to which the substrate 10 is fixed may be formed on a base plate 111. The base plate 111 may be a large flat area that is formed of granite or the like. A plurality of columns 112 may be formed on the base plate 111, and a support member 113 may be disposed on the columns 112. In addition, a rotation member 114 may be formed on the support member 113, and the main optical system 105 and the second telescope lens module 104 may be disposed on the rotation member 114. The main optical system 105 and the second telescope lens module 104 coupled thereto may be rotatably formed on an XY plane by the rotation member 114.

According to an embodiment, the crystallization apparatus 100 is characterized in that the main optical system 105 and the second telescope lens module 104 coupled thereto are configured to rotate with respect to the laser generating device 101 (and, the extension optical system 102 coupled to the laser generating device 101 and the first telescope lens module 103). The main optical system 105 and the second telescope lens module 104 coupled thereto may be rotatably formed with respect to the base plate 111.

The operation of the crystallization apparatus 100 will now be described in more detail.

When an amorphous silicon layer of a substrate is crystallized using a sequential lateral solidification (SLS) method;

since the number of protrusions of a predetermined portion may be greater or smaller than other normal portions, a diagonal or wavy strain may be formed.

Figure 2:
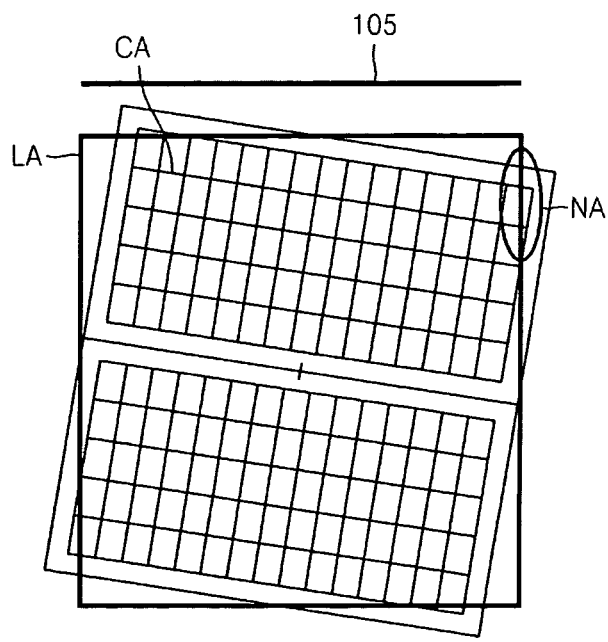
FIG. 2 illustrates a case where a stage is tilted at a predetermined degree when the crystallization apparatus is fixed.

In order to prevent formation of the strain, a method of tilting a stage including a substrate at a predetermined degree has been suggested. FIG. 2 illustrates a case where a stage is tilted at a predetermined degree when the crystallization apparatus is fixed. When the stage is tilted at a predetermined degree when the crystallization apparatus is fixed, formation of a strain is prevented. However, as shown in FIG. 2, a portion of a crystallization region CA on which crystallization needs to be performed deviates from a laser irradiation region LA onto which a laser beam is irradiated, and a non-crystallization region NA may be formed.

In order to overcome this problem, a method of tilting a slit of a mask for crystallization has been suggested. In this case, crystallization characteristics may be controlled by controlling a scan pitch, that is, a distance the stage moves between laser pulses. When the scan pitch is small, productivity is reduced. When the scan pitch is large, a strain may be formed due to non-uniformity of thin film transistor (TFT) characteristics.

In order to overcome this problem, according to an embodiment, the crystallization apparatus 100 is characterized in that the main optical system 105 and the second telescope lens module 104 coupled thereto are rotatably formed with respect to the laser generating device 101 and the base plate 111.

Figure 3:
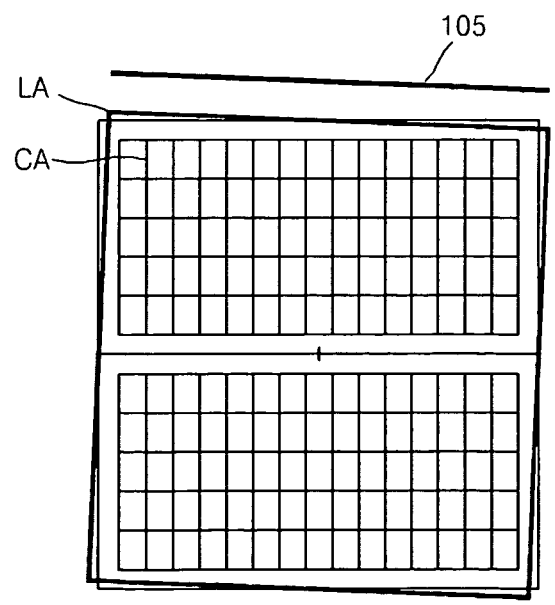
FIG. 3 illustrates a case where only a second telescope lens module and a main optical system are tilted at a predetermined degree when a substrate is fixed.

FIG. 3 illustrates a case where only the second telescope lens module 104 and the main optical system 105 are tilted at a predetermined degree while the substrate 10 is fixed. As illustrated in FIG. 3, when the substrate 10 is fixed, only the second telescope lens module 104 and the main optical system 105 are tilted at a predetermined degree, since the crystallization region CA is contained in the laser irradiation region LA, and thus, the formation of a non-crystallization region NA may be avoided.

In this case, only the second telescope lens module 104 and the main optical system 105 of the crystallization apparatus 100, rather than an entire portion of the crystallization apparatus 100, are rotated with respect to the laser generating device 101. Moving the laser generating device 101 may be avoided, since the laser generating device 101 may be very sensitive to impacts that may occur when moving the laser generating device 101 even by a very small amount.

Thus, a method of rotating the x-y stage 106 to which the substrate 10 is fixed has a disadvantage that the non-crystallization NA is formed as described above. In order to overcome this problem, according to an embodiment, only the second telescope lens module 104 and the main optical system 105 of the crystallization apparatus 100 are rotated with respect to the laser generating device 101, thereby simultaneously preventing formation of a strain during crystallization and formation of non-crystallization.

Hereinafter, a structure of an organic light emitting display apparatus manufactured using the crystallization apparatus will be described.

Figure 4:
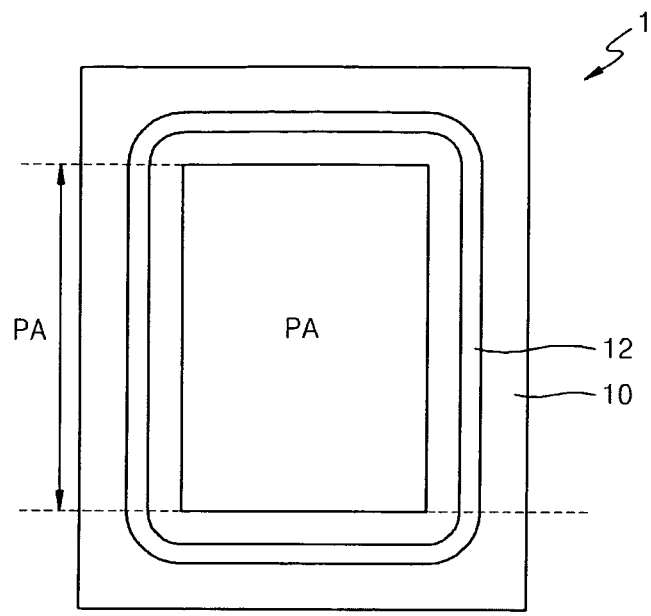
FIG. 4 illustrates a plan view of an organic light emitting display apparatus manufactured using the crystallization apparatus of FIG. 1, according to an embodiment.
Figure 5:
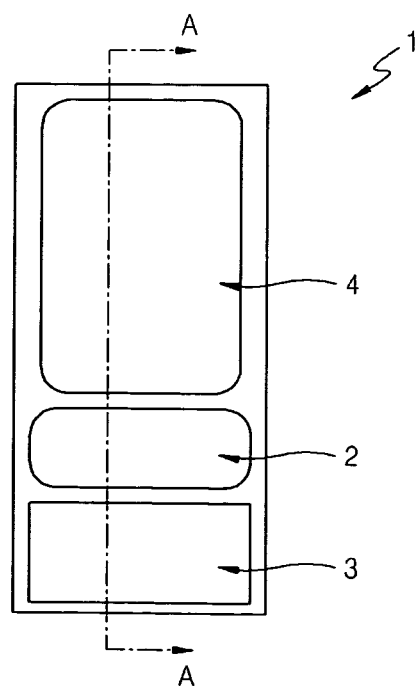
FIG. 5 illustrates a plan view of a single pixel of the organic light emitting display apparatus of FIG. 4, according to an embodiment.
Figure 6:
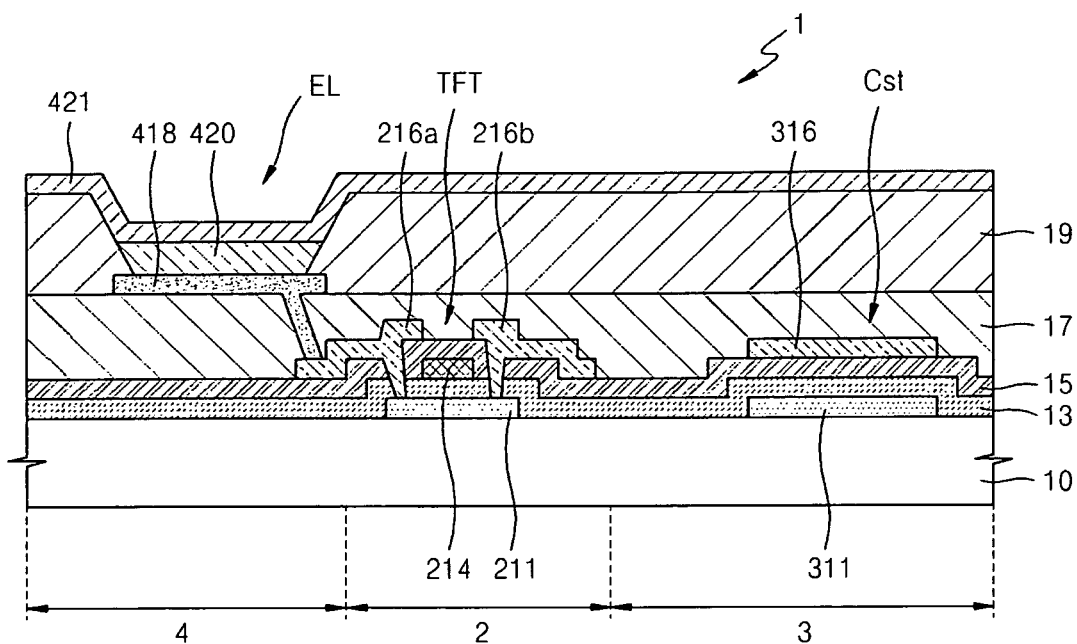
FIG. 6 illustrates a cross-sectional view of the organic light emitting display apparatus taken along a line A-A of FIG. 5.

FIG. 4 illustrates a plan view of an organic light emitting display apparatus 1 manufactured using the crystallization apparatus of FIG. 1, according to an embodiment. FIG. 5 illustrates a plan view of a single pixel of the organic light emitting display apparatus 1 of FIG. 4, according to an embodiment. FIG. 6 illustrates a cross-sectional view of the organic light emitting display apparatus 1 taken along a line A-A of FIG. 5. It is to be understood that an organic light emitting display apparatus manufactured using a crystallization apparatus of FIG. 1 is not limited and may differ from what is described and illustrated herein.

Referring to FIG. 4, the organic light emitting display apparatus 1 includes a first substrate 10 including a TFT, an organic light emitting diode and the like, and a second substrate (not shown) is coupled to the first substrate 10 by using a sealing member 12.

A plurality of pixels, each of which includes a TFT, an organic light emitting diode EL, a storage capacitor Cst and the like, may be formed on the first substrate 10. In addition, the first substrate 10 may be a low temperature poly-si (LTPS) substrate, a glass substrate, a plastic substrate, a stainless steel (SUS) substrate, or the like.

The second substrate may be a sealing substrate that is disposed on the first substrate 10 so as to prevent external moisture or air from penetrating into the TFT and the organic light emitting diode EL of the first substrate 10. The second substrate may face the first substrate 10. The first substrate 10 and the second substrate may be coupled by the sealing member 12 disposed along an edge of the second substrate. The second substrate may be a transparent glass substrate or a plastic substrate.

The first substrate 10 includes a pixel area PA from which light is emitted, and a circuit area (not shown) disposed outside the pixel area PA. According to embodiments, the first substrate 10 and the second substrate are adhered to each other by disposing the sealing member 12 in the circuit area outside the pixel area PA.

Referring to FIGS. 5 and 6, the single pixel of the organic light emitting display apparatus 1 of FIG. 4 includes a channel region 2, a storage region 3, and an emitting region 4. In this case, in FIG. 5, the channel region 2, the storage region 3, and the emitting region 4 are disposed in line with each other, but the present invention is not limited thereto. That is, the storage region 3 and the emitting region 4 are formed in a longitudinal direction so as to be adjacent to each other. At one side of the storage region 3 and the emitting region 4, the channel region 2 may be formed so as to be adjacent to each of the storage region 3 and the emitting region 4.

The channel region 2 includes the TFT. The TFT includes an active layer 211, a gate electrode 214, and source/drain electrodes 216a and 216b. A first insulating layer 13 is interposed between the gate electrode 214 and the active layer 211 so as to insulate the gate electrode 214 and the active layer 211 from each other. Source/drain regions to which high-concentration impurities are injected are formed on two edges of the active layer 211, and are connected to the source/drain electrodes 216a and 216b, respectively.

The storage region 3 includes the storage capacitor Cst. The storage capacitor Cst includes a first capacitor electrode 311 and a second capacitor electrode 316. The insulating layer 13 is interposed between the first capacitor electrode 311 and the second capacitor electrode 316. In this case, the first capacitor electrode 111 may be formed of the same material and on the same layer as the active layer 211 of the TFT. The second capacitor electrode 316 may be formed of the same material and on the same layer as the source/drain electrodes 216a and 216b of the TFT.

The emitting region 4 includes the organic light emitting diode EL. The organic light emitting diode EL includes a pixel electrode 418 connected to any one of the source/drain electrodes 216a and 216b of the TFT, an opposite electrode 421 facing the pixel electrode 418, and an intermediate layer 420 interposed between the opposite electrode 421 and the pixel electrode 418. The pixel electrode 418 is formed of a transparent conductive material.

Figure 7:
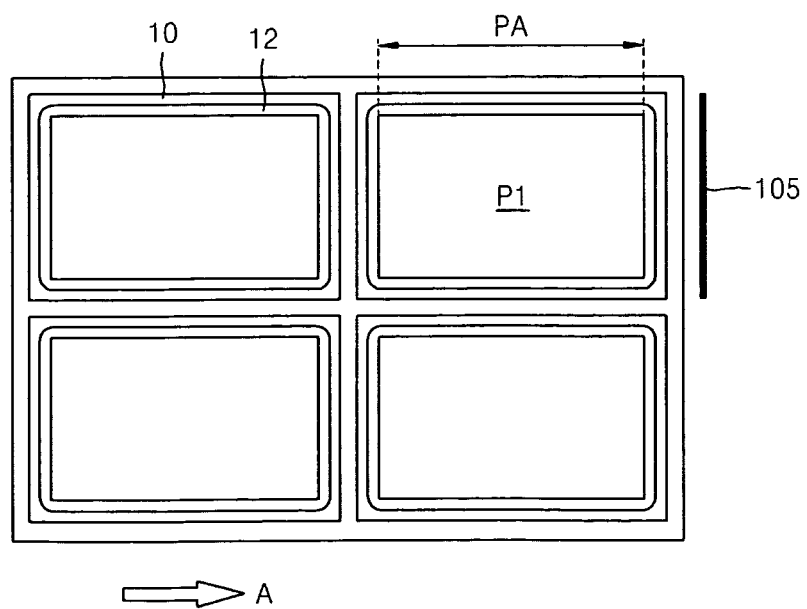
FIG. 7 illustrates a plan view for explaining a process of crystallizing a substrate by using a laser beam emitted from a laser generating device, according to an embodiment.

FIG. 7 illustrates a plan view for explaining a process of crystallizing a substrate by using a laser beam emitted from a laser generating device, according to an embodiment. As illustrated in FIG. 7, as the size of an organic light emitting display apparatus is increased, a plurality of panels (i.e., a plurality of organic light emitting display apparatuses) may be formed on a single mother glass.

In detail, when the x-y stage 106 (see FIG. 1) on which the substrate 10 is disposed is moved in a direction indicated by an arrow A with respect to the crystallization apparatus 100, if a laser beam emitted from the laser generating device 101 (see FIG. 1) is irradiated onto a first panel P1 through the extension optical system 102, the first telescope lens module 103, the second telescope lens module 104, and the main optical system 105, predetermined regions of the first panel P1 are crystallized.

Hereinafter, a method of crystallizing amorphous silicon by using a SLS method with the crystallization apparatus 100 will be described.

In general, crystalline silicon is used to form a buffer layer (not shown) as an insulating layer on the substrate, amorphous silicon is deposited on the buffer layer, and then the amorphous silicon is crystallized.

In this case, the laser beam generated by the laser generating device 101 of the crystallization apparatus 100 may be a pulse laser beam, rather than a conventional continuous wave (CW) laser. For example, when the laser generating device 101 generates a pulse laser beam with a frequency of 6000 Hz, a high frequency laser beam is irradiated onto the substrate 10 at a frequency of 6000 times per second.

When the pulse laser beam generated by the laser generating device 101 is irradiated onto the substrate 10, grains are grown from each of side interfaces of an amorphous silicon layer in a melting area onto which a laser beam is irradiated. The grains stop growing when grain boundaries of the grains collide with each other such that a core generating region does not exist between the grains. In addition, when a moving speed of the laser generating device 101 is adjusted so that a subsequent laser irradiation region somewhat overlaps with a current laser irradiation region, a two-shot crystallization effect may be obtained via a single scan in one direction.

When the pulse laser beam generated by the laser generating device 101 is irradiated onto the substrate 10 a first time, poly-si is formed while amorphous silicon is dissolved and then solidified in the melting region onto which the pulse laser is irradiated. Then, the laser generating device 101 is moved in one direction during a rest period between pulses. In this case, a following laser irradiation region (that is, the melting region) and a prior laser irradiation region overlap each other due to the moving speed of the laser generating device 101 being adjusted. At this time, when the pulse laser beam is irradiated onto the substrate 10 a second time, poly-si is dissolved and then crystallized in a portion where a first laser irradiation region and a second laser irradiation region overlap each other, and crystallization is performed. Likewise, crystallization of a channel region and a storage region in a single pixel may be performed by periodically irradiating a laser beam while moving the laser generating device 101 in one direction.

By way of summation and review, one or more embodiments provide crystallization apparatuses using sequential lateral solidification (SLS), in which a main optical system is formed so as to be capable of tilting at a predetermined angle with respect to a laser generating device.

Accordingly, formation of a strain during crystallization and formation of a non-crystallization area may be simultaneously prevented.

While various aspects have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A crystallization apparatus that performs crystallization on a substrate using a sequential lateral solidification (SLS) method, the crystallization apparatus comprising:
a laser generating device for emitting a laser beam;
a first telescope lens module and a second telescope lens module at one side of the laser generating device for minimizing a divergent angle of a laser beam emitted by the laser generating device;
a main optical system at one side of the second telescope lens module for uniformizing and amplifying a laser beam transmitted through the second telescope lens module; and
a rotation member on which the main optical system is disposed,
wherein the main optical system is rotatable with respect to the laser generating device.

2. The crystallization apparatus of claim 1, wherein the second telescope lens module and the main optical system are integrally rotatable with respect to the laser generating device.

3. The crystallization apparatus of claim 1, wherein, when the main optical system is rotatable at a predetermined angle, an entire portion of a crystallization region of the substrate where crystallization is to be performed being contained in a laser irradiation region.

4. The crystallization apparatus of claim 1, wherein the main optical system includes a beam uniformizer for ensuring that a profile of a laser beam transmitted through the second telescope lens module with predetermined power is uniform, and a beam width controller for controlling a beam width of a laser beam transmitted through the beam uniformizer to be maintained within a predetermined range.

5. The crystallization apparatus of claim 1, further comprising an extension optical system interposed between the laser generating device and the first telescope lens module, the extension optical system extending a sustain period per pulse of a laser beam emitted from the laser generating device.

6. The crystallization apparatus of claim 1, wherein a laser beam transmitted through the main optical system and irradiated onto the substrate is a linear laser beam.

7. The crystallization apparatus of claim 1, wherein the laser beam generated by the laser generator is irradiated onto the substrate while the substrate is relatively movable with respect to the crystallization apparatus.

8. The crystallization apparatus of claim 1, wherein the laser beam generated by the laser generating device is a pulse laser beam.

9. The crystallization apparatus of claim 8, wherein a first laser irradiation region of the substrate onto which the pulse laser beam is irradiated partially overlaps with a second laser irradiation region of the substrate onto which the pulse laser beam is subsequently irradiated.

10. The crystallization apparatus of claim 9, wherein amorphous silicon of an overlapped region of the first laser irradiation region and the second irradiation region is crystallized while being dissolved and solidified two times.

11. The crystallization apparatus of claim 1, further comprising:
a base plate to which the substrate is fixed;

the rotation member being spaced apart from the base plate by a predetermined interval, rotatably disposed on the base plate,
and rotatable with respect to the base plate.

12. The crystallization apparatus of claim 11, further comprising:
a plurality of columns extending from one surface of the base plate; and
a support member on the plurality of columns,
wherein the rotation member is on the support member.

13. The crystallization apparatus of claim 11, wherein the second telescope lens module is coupled to the main optical system, and is rotatable together with the main optical system with respect to the base plate.

14. The crystallization apparatus of claim 11, wherein the rotation member is rotatable on a plate disposed in parallel to a surface of the substrate to which the laser beam is irradiated.

* * * * *